(12) United States Patent
Hapke

(10) Patent No.: US 7,139,953 B2
(45) Date of Patent: Nov. 21, 2006

(54) INTEGRATED CIRCUIT WITH TEST CIRCUIT

(75) Inventor: Friedrich Hapke, Winsen/Luhe (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/506,234

(22) PCT Filed: Feb. 26, 2003

(86) PCT No.: PCT/IB03/00760

§ 371 (c)(1),
(2), (4) Date: Feb. 2, 2005

(87) PCT Pub. No.: WO03/075028

PCT Pub. Date: Sep. 12, 2003

(65) Prior Publication Data

US 2005/0160338 A1    Jul. 21, 2005

(30) Foreign Application Priority Data

Mar. 1, 2002  (DE) .............................. 102 09 078

(51) Int. Cl.
G01R 31/28 (2006.01)
G16F 11/00 (2006.01)
(52) U.S. Cl. ................ 714/734; 714/739; 714/732
(58) Field of Classification Search .................. None
See application file for complete search history.

(56) References Cited

U.S. PATENT DOCUMENTS 4,503,537 A * 3/1985 McAnney .................. 714/728
4,862,068 A * 8/1989 Kawashima et al. ....... 324/73.1
5,762,216 A * 6/1998 Takeuchi .................... 215/235

* cited by examiner

Primary Examiner—Christine T. Tu

(57) ABSTRACT

Integrated circuit with an application circuit (1) to be tested, and a self-test circuit (5-16) which is provided for testing the application circuit (1) and comprises an arrangement (5-9) for generating desired test patterns which are applied to the application circuit (1) for test purposes, wherein the output signals occurring in dependence upon the test patterns through the application circuit (1) are evaluated by means of a signature register (13), the arrangement (5-9) for generating the desired test patterns comprising a bit modification circuit (9) which individually controls first control inputs of combination logics (6, 7, 8) in such a way that a pseudo-random sequence of test patterns supplied by a shift register is modified such that, by approximation, the desired test patterns are obtained, and which controls second control inputs of the combination logics (6, 7, 8), by means of which the first control inputs can be blocked, such that those test patterns that are supplied by the shift register (5) and are already desired test patterns are not modified by the bit modification circuit (9) by means of controlling the first control inputs of the combination logics (6, 7, 8).

5 Claims, 1 Drawing Sheet

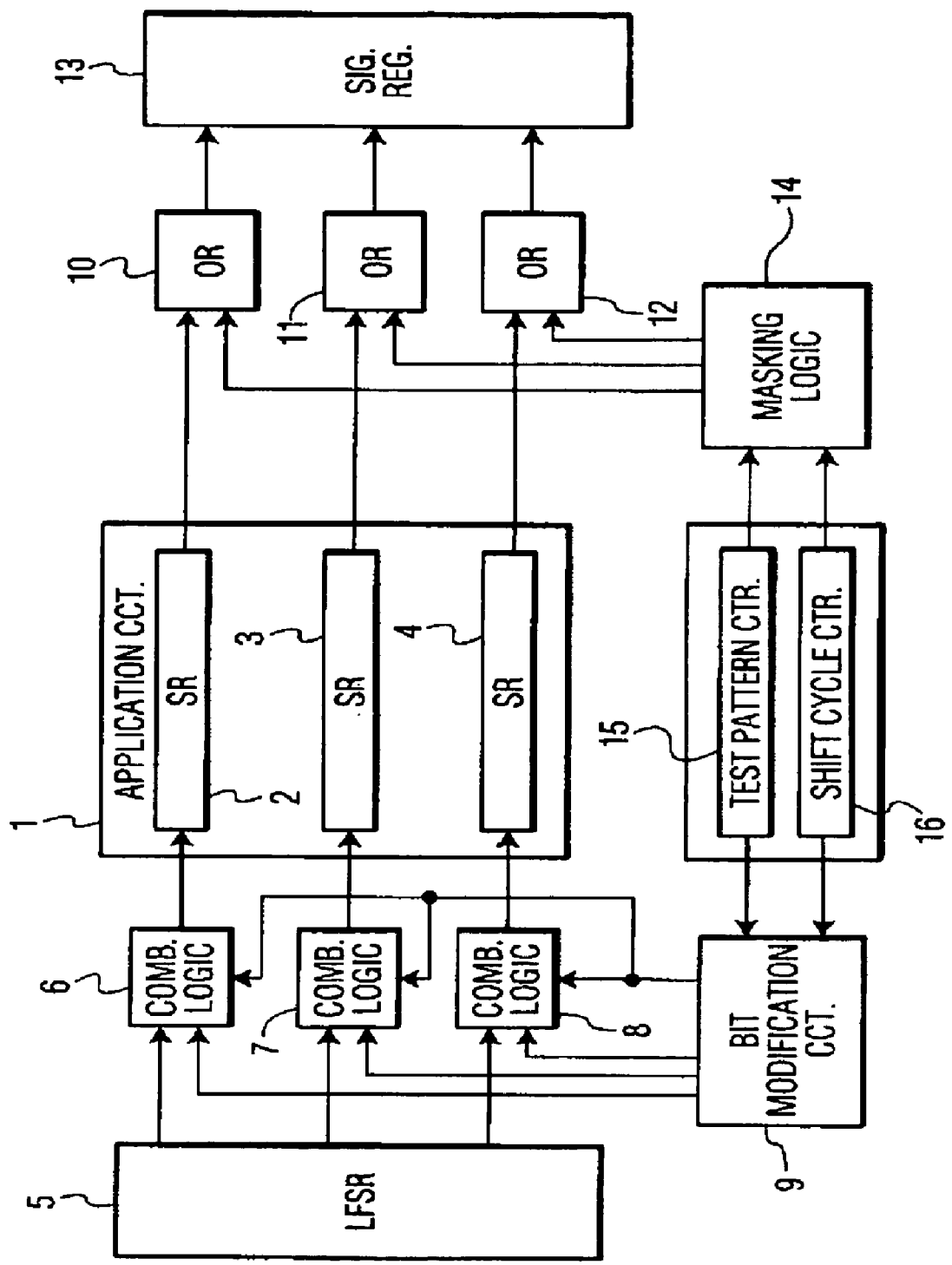

INTEGRATED CIRCUIT WITH TEST CIRCUIT

The invention relates to an integrated circuit with an application circuit to be tested, and a self-test circuit which is provided for testing the application circuit and comprises an arrangement for generating deterministic test patterns which are applied to the application circuit for test purposes, wherein the output signals occurring in dependence upon the test patterns through the application circuit are evaluated by means of a signature register. The arrangement for generating deterministic test patterns comprises a bit modification circuit which is to modify a pseudo-random sequence of test patterns supplied by a shift register in such a way by means of combination logics that a desired, deterministic test pattern sequence is obtained.

When manufacturing integrated circuits, there is the general wish to test their function. Such tests may be performed by external test arrangements. Due to the very high integration density of such circuits, the very high clock rates at which these circuits operate and the very large numbers of required test vectors, the external tests involve many problems and costs. The high internal clock rates of the integrated circuits are in an unfavorable proportion to the comparatively very slow input/output bond pad stages which lead to the exterior. It is therefore desirable to be able to perform a kind of self-test of the integrated circuit. The integrated circuit accommodates a self-test circuit which is used for testing the application circuit which is also incorporated in the integrated circuit. The application circuit represents the circuit which is provided for the actual purpose of use of the integrated circuit.

Testing such circuits involves further problems with components within the circuit which produce a so-called "X" during testing, i.e. a signal which cannot be evaluated unambiguously. Such signals are particularly produced by those components having an analog or storage behavior.

For example, RAMs arranged within the application circuit may produce arbitrary output signals. Signals produced by such a RAM and propagated through the circuit can no longer be evaluated unambiguously at the output of the circuit during testing.

To evade this problem, it is known from EP 1178322 A2 to provide an arrangement for generating deterministic test patterns within the circuit, which arrangement comprises a bit modification circuit which is to modify, by means of combination logics, a pseudo-random sequence of test patterns supplied by a shift register, such that, by approximation, a desired test pattern sequence is obtained. However, in practice this cannot be realized completely because the bit modification circuit advantageously built up in hardware should be as simple as possible and thus does not only perform desired bit modifications but also undesired ones. This means that those test patterns which are already desired test patterns are also modified, but should actually not be modified.

It is an object of the invention to further improve the test circuit known from DE (000110) to such an extent that the bit modification circuit does not modify test patterns that are already desired deterministic test vectors.

According to the invention, this object is solved by the characteristic features of claim 1.

An integrated circuit with an application circuit to be tested, and a self-test circuit which is provided for testing the application circuit and comprises an arrangement for generating desired test patterns which are applied to the application circuit for test purposes, wherein the output signals occurring in dependence upon the test patterns through the application circuit are evaluated by means of a signature register, the arrangement for generating the desired test patterns comprising a bit modification circuit which individually controls first control inputs of combination logics in such a way that a pseudo-random sequence of test patterns supplied by a shift register is modified such that, by approximation, the desired test patterns are obtained, and which controls second control inputs of the combination logics, by means of which the first control inputs can be blocked, such that those test patterns that are supplied by the shift register and are already desired test patterns are not modified by the bit modification circuit by means of controlling the first control inputs of the combination logics.

As already elucidated in the opening paragraph, the bit modification circuit modifies, by means of corresponding control of the first inputs of the combination logics, possibly also those pseudo-random test patterns supplied by the shift register that are already desired test patterns. According to the invention, a further control possibility of the combination logics is therefore provided, namely second control inputs by means of which the combination logics can be controlled in such a way that the modifications performed by controlling the first inputs are blocked. The bit modification circuit is implemented in such a way that these second inputs are controlled when already desired test patterns are concerned which, consequently, need not be modified.

The reason is that the bit modification circuit generally built in hardware is not capable of accurately supplying the required modification control words for the first control inputs, because its number of components should be minimal due to the space occupied on the integrated circuit. Thus it is possible to have a small bit modification circuit and yet supply only desired test patterns to the circuit to be tested. The desired test patterns may be deterministic or random test patterns.

A further essential advantage of the integrated circuit with a self-test circuit according to the invention is that the application circuit need not be modified for the test processes, i.e. it can be built up in a way which is optimal for using the application circuit. The self-test circuit does not influence the normal operation and use of the application circuit in any way.

Furthermore, the self-test circuit according to the invention allows a test of the application circuit to be performed on the chip so that relatively slow bond pad connections do not disturb the tests and the application circuit can be operated at maximum clock rates.

In accordance with an embodiment of the invention as defined in claim 3, the test pattern counter may be advantageously used to supply a signal signalizing to the masking logic which test pattern passes through the application circuit during a plurality of test procedures so that the masking logic can block the bits affected in these procedures by storing or analog components in the output signal of the application circuit during testing.

A shift cycle counter provided in accordance with a further embodiment of the invention as defined in claim 4 signalizes, to the masking logic, the state of shift registers provided in the application circuit. It is thereby known which bits of the shift register are to be blocked by the masking logic and which are not to be blocked.

These and other aspects of the invention are apparent from and will be elucidated with reference to the embodiments described hereinafter.

In the drawing:

The sole FIGURE is a block diagram of an integrated circuit comprising an application circuit 1. This application circuit is the circuit conceived for use of the integrated circuit.

It is desirable to test whether the application circuit 1 operates flawlessly after manufacture of the integrated circuit. To this end, a self-test circuit is provided on the integrated circuit, which self-test circuit comprises the circuit elements 5 to 16 as shown in the FIGURE.

In the integrated circuit according to the invention, this self-test circuit is implemented in such a way that it is completely built up outside the application circuit 1 so that it does not influence its behavior during normal operation.

In the embodiment shown in the FIGURE, it is assumed that the application circuit 1 comprises three circuit chains 2, 3 and 4 which are shift registers. Alternatively, a larger or smaller number of shift registers may be provided.

The self-test circuit incorporates a linear feedback shift register 5 supplying a pseudo-random sequence of test patterns. Since the shift register 5 is fed back and has only a finite length, this test pattern sequence is not really random but has a repetitive pattern. However, this pattern sequence has the drawback that it does not actually comprise test patterns which are optimal for testing the application circuit 1.

For this reason, a bit modification circuit 9 is provided which changes, via combination logic 6, 7, and 8, the output signals of the linear feedback shift register 5 in such a way that test patterns having a predeterminable and deterministic structure are obtained at the outputs of the combination logics 6, 7 and 8 and hence at the inputs of the application circuit 1 and their circuit chains 2, 3 and 4. This is achieved in that the modification circuit 9 modifies, by means of the combination logics 6, 7 and 8, individual bits of the test patterns supplied by the linear feedback shift register 5, such that desired test patterns are obtained. The desired test patterns may be deterministic or random test patterns.

Unfortunately, this does not always work. Particularly when the size of the bit modification circuit 9 generally built up in hardware should be small, it is not capable of modifying all pseudo-random test patterns supplied by the shift register 5 in such a way that only the desired test patterns are passed on to the circuit 1 to be tested. Test patterns which are supplied by the shift register 5 and are already desired test patterns are also modified, which is undesirable.

According to the invention, a further control possibility of the combination logics 6, 7 and 8 is therefore provided, namely second control inputs by means of which the combination logics 6, 7 and 8 can be controlled in such a way that they block the control signals at their first inputs. Thus, when the second control inputs are controlled, there is no modification of the bits by means of the combination logics.

The bit modification circuit 9 is implemented in such a way that these second control inputs of the combination logics 6, 7 and 8 are controlled when test patterns which are already the desired test patterns, are supplied by the shift register 5.

Unwanted modifications are thus blocked.

All test patterns passing through the combination logics, i.e. all desired test patterns, are applied to the circuit chains 2, 3 and 4 within the application circuit 1 in accordance with the embodiment shown in the FIGURE.

Based on these test patterns, the circuit chains 2, 3 and 4 within the application circuit 1 supply output signals which are applied via OR gates 10, 11 and 12 to a signature register 13.

The signature register 13 is implemented in such a way that it combines the test results in a plurality of test cycles each comprising a test pattern and, after the test procedure, supplies a so-called signature which must have a given predetermined value in the case of undisturbed operation of the application circuit 1.

Here, however, there is problem that circuit elements with an analog or a storage behavior may (and generally are) provided in the application circuit 1 or within its circuit chains 2, 3 and/or 4. Such circuit elements do not supply an unambiguous output signal, i.e. in dependence upon the input signal applied thereto, they do not supply a deterministic output signal. Their output signal is rather random. It is obvious that such signals do not only disturb the test results but render given bits within the test results unusable.

Nevertheless, in order to be able to test the application circuit 1 also with such components by means of a possibly simple structure, a masking logic 14 is provided, which supplies control signals to the OR gates 10, 11 and 12. By means of these signals, the masking logic 14 controls the OR gates 10, 11 and 12 in such a way that only those bits that are not affected by components having a storing or analog behavior reach the signature register 13 during testing.

Consequently, only those bits that can be unambiguously evaluated and produce an unambiguous result reach the signature register 13. Even when the application circuit 1 comprises components with a storing or analog behavior, an unambiguous signature flawlessly indicating a test result can be generated in the signature register 13 at the end of the test.

In order to inform the masking logic 14 in how far the test has proceeded, a test pattern counter 15 is provided which supplies a corresponding signal to the masking logic 14 and the bit modification circuit 9.

The masking logic 14 is programmed and circuit-technically implemented in such a way that it knows, by way of the number of the current test pattern supplied by the test pattern counter, which bits can be evaluated in the output signals of the circuit chains 2, 3 and 4 of the application circuit 1 and can be passed on to the signature register 13, or which bits are to be blocked by means of the OR gates 10, 11 and 12.

Furthermore, a shift cycle counter 16 is provided, whose output signal again reaches the bit modification circuit 9 and the masking logic 14.

The shift cycle counter 16 supplies a signal signalizing the state of the shift registers 2, 3 and 4 to the masking logic 14. The position of the counter 16 indicates to the masking logic which positions of the shift registers 2, 3 and 4 should be masked.

The self-test circuit according to the invention provides the possibility of testing the application circuit 1 on the chip without any limitations. No modification of the application circuit 1 is required so that it can be optimally implemented for its actual operation. Testing at the full clock rates is also possible because the slow, external bond pad connections need not be used for testing. Moreover, all test procedures are also possible to an unlimited extent for application circuits comprising components with a storing or analog behavior. It is further ensured that only test patterns which are actually desired deterministic or random test patterns reach the circuit 1 to be tested. Nevertheless, the number of components of the bit modification circuit may be maintained small and thus also the space occupied on the integrated circuit.

The invention claimed is:

1. An integrated circuit with self-test capability, comprising:
    a shift register for generating a pseudo-random sequence of test patterns;
    combinatorial logic responsive to said pseudo-random sequence of test patterns for modifying selected test patterns to obtain desired test patterns;
    an application circuit for producing output signals in response to the desired test patterns, the application circuit being provided with shift registers for test purposes;
    a signature register for storing result signals in response to said output signals; and
    a bit modification circuit for controlling said combinatorial logic such that:
        i) test patterns that are not desired test patterns are modified to produce desired test patterns; and
        ii) test patterns that are desired test patterns are not modified.

2. An integrated circuit as claimed in claim 1, wherein the bit modification circuit is formed as a hardware circuit.

3. An integrated circuit as claimed in claim 1, further comprising:
    a gating circuit coupled to said output signals and to said signature register;
    a test pattern counter for supplying a characteristic number of an active test pattern; and
    masking logic coupled to said test pattern counter and to said gating circuit;
    wherein the masking logic controls said gating circuit in response to said characteristic number of an active test pattern.

4. An integrated circuit as claimed in claim 3, further comprising a shift cycle counter coupled to the masking logic, the shift cycle counter indicating to the masking logic the shift state of shift registers in the application circuit.

5. An integrated circuit as claimed in claim 1, further comprising masking logic for, during testing, blocking bits of the output signals of the application circuit that, based on the circuit structure of the application circuit, have undefined states, and for supplying only other bits having defined states to the signature register.

* * * * *